United States Patent
Unsworth et al.

(10) Patent No.: US 7,081,757 B2
(45) Date of Patent: Jul. 25, 2006

(54) RE-LOCATABLE PARTIAL DISCHARGE TRANSDUCER HEAD

(75) Inventors: Joseph Unsworth, Oatlands (AU); David Tallis, Bilgola (AU)

(73) Assignee: Siemens LTD, Bayswater (AU)

( * ) Notice: Subject to any disclaimer, the term of this patent is extended or adjusted under 35 U.S.C. 154(b) by 0 days.

(21) Appl. No.: 10/363,429

(22) PCT Filed: Aug. 22, 2001

(86) PCT No.: PCT/AU01/01039

§ 371 (c)(1),
(2), (4) Date: Aug. 28, 2003

(87) PCT Pub. No.: WO02/18963

PCT Pub. Date: Mar. 7, 2002

(65) Prior Publication Data

US 2004/0046568 A1    Mar. 11, 2004

(30) Foreign Application Priority Data

Aug. 29, 2000  (AU) .................................. PQ9751

(51) Int. Cl.
*H01H 9/50* (2006.01)
*G01R 31/06* (2006.01)
*G01H 73/658* (2006.01)

(52) U.S. Cl. .................. 324/536; 324/547; 73/658

(58) Field of Classification Search ............... 324/546, 324/547, 536, 521, 520, 519, 555, 522–524, 324/726; 73/658
See application file for complete search history.

(56) References Cited

U.S. PATENT DOCUMENTS

| 3,654,420 | A | * | 4/1972 | Saito et al. | 219/69.19 |
| 4,439,723 | A | * | 3/1984 | Loftness | 324/555 |
| 4,691,628 | A | * | 9/1987 | Simpson | 100/37 |
| 5,243,007 | A | * | 9/1993 | Chatelain et al. | 526/344.1 |
| 5,419,197 | A | * | 5/1995 | Ogi et al. | 73/659 |
| 5,551,881 | A |   | 9/1996 | Henderson et al. | |
| 5,878,784 | A | * | 3/1999 | Sales et al. | 138/93 |
| 5,905,352 | A | * | 5/1999 | Carbaugh et al. | 318/611 |
| 6,340,890 | B1 | * | 1/2002 | Bengtsson et al. | 324/536 |
| 6,458,233 | B1 | * | 10/2002 | Carisella | 156/189 |
| 6,774,639 | B1 | * | 8/2004 | Unsworth | 324/547 |

FOREIGN PATENT DOCUMENTS

| WO | WO 94/28566 A1 | 12/1994 |
| WO | WO 01/18554 A1 | 3/2001 |

* cited by examiner

*Primary Examiner*—Vincent Q. Nguyen
*Assistant Examiner*—Jeff Natalini
(74) *Attorney, Agent, or Firm*—Browdy and Neimark, PLLC

(57) ABSTRACT

An apparatus (10) for detecting the occurrence of partial discharge in electrical equipment, such as high voltage transformers. The apparatus comprises a detecting means including an ultrasonic transducer (11) mounted at one end of an electrically insulating elongate rod (13). The ultrasonic transducer (11) is adapted to detect ultrasonic pulses or waves generated by the occurrence of a partial discharge in the electrical equipment. A radio frequency (RF) transducer (17) is also utilized to detect radio frequency (RF) pulses or waves also generated by the partial discharge. The rod (13) can be mounted in the wall of the electrical equipment and so provide a mechanism for adjusting the position of the detecting means within the electrical equipment. The apparatus is also removable from the electrical equipment and re-locatable to other equipment.

17 Claims, 3 Drawing Sheets

RE-LOCATABLE PARTIAL DISCHARGE TRANSDUCER HEAD

FIELD OF THE INVENTION

The present invention relates to a system for monitoring the performance of electrical equipment, such as high-voltage transformers. In particular, the system comprises transducers that can be used to detect and locate faults in the overall insulation of transformers.

BACKGROUND OF THE INVENTION

High voltage generator and transmission transformers form an integral part of any electrical power generation, distribution and transmission system. Other transformers, such as rectifier transformers are also used in industrial processes, such as smelting and electro-deposition processes. Also, current transformers (CTs) are used for protection and metering of electricity distribution systems.

The most important part of the insulation for oil filled transformers comprises paper which is wound around the copper windings and the oil itself. There are spacers, washers, seals, lead through plates, taps and bushings, which are also part of the insulation system within the transformer. In order to enhance the insulation and stability, the paper is permeated with a dielectric, typically mineral oil or silicone oil, which fills the transformer. This insulating oil also serves as a coolant by distributing heat by convection or forced flow and also quenches discharges.

Other types of transformers include solid filled transformers which use polymeric dielectrics. This epoxy thermoset is vacuum back-filled into the transformer. There are also gas-filled transformers for example, those used in underground mines. Such transformers are usually filled with gases such as argon or sulfur hexafluoride for safety. There are also some low voltage air filled transformers.

The operating lifetime of a high voltage transformer can be greater than 35 years. The lifetime depends on the loading, design, quality of manufacture, and the materials and maintenance routines. During its lifetime, the transformer insulation can degrade, the rate of degradation being dependent upon the workload and the internal operating environment of the transformer, such as temperature, moisture content, pH and the like. Any degradation of the insulation, such as electronic and ionic plasma erosion of solid insulation surrounding an air bubble occluded due to faulty manufacture, can result in increasing levels of partial discharge within the solid thermoset filled transformer. Occurrence of partial discharges in mineral oil also leads to evolution of gases such as hydrogen and acetylene within the transformer. Such increased partial discharge leads to further degradation of the insulation which in turn leads to increasable levels of partial discharge. Continued degradation of the insulation can result in severe discharges, short-circuit faults or a catastrophic failure due to an explosion of the gases, for example, hydrogen, acetylene and ethylene, produced as chemical by-products of the degradation process. Such failure can result in reduction or loss of supply (outage) to the power system, incur considerable expense for the replacement or repair of the transformer and also present a serious risk to nearby personnel and the environment.

Partial discharge in transformers can also occur due to faulty manufacture and or mechanical or electrical fatigue. For example the movement, creep and stress relaxation of metallic components, such as fastenings or foreign metallic bodies within the transformer, provide an opportunity for discharges to occur even when there has been no or little degradation of the insulation.

Partial discharge in transformers can also arise due to windings becoming loose within the transformer. Wear and tear suffered by the tap connectors and backlash in the tap changer can also cause partial discharges and arcing. Faults in the bushings can also result in partial discharges.

It is known that a partial discharge can produce signals at different locations within a large transformer including a discharge current in neutral caused by imbalance, a displacement current through the capacitive tapping of a bushing, a radiated radio frequency (RF) pulse or wave and a radiated ultrasonic (US) pulse or wave.

The magnitude of partial discharge within a transformer provides one means of determining the integrity of the transformer's insulation. For example, a detected partial discharge having a magnitude of 50 pC would normally be ignored at normal voltage operations, a reading of 500 pC would be viewed with some concern, whilst a reading of 500 pC would be considered potentially dangerous. Just as important is the frequency of occurrence or activity of the discharges. For example, 200 pC to 500 pC occurring frequently can do more damage than 1000 pC occurring infrequently.

Power authorities typically test transformers by sampling the mineral oil within the transformer about once a year to analyse and determine the oil's dissolved gas concentration (DGA) and dielectric loss angle (DLA). If high gas readings are obtained the frequency of sampling may be increased to monthly and even weekly. However, there is always some delay between the sampling and the analysis in the laboratory. There is also delay in carrying out diagnosis based on this analysis. Rapid deterioration of insulation may not be detected early enough and transformers have failed catastrophically even when dissolved gas analysis (DGA) sampling has been carried out Since it is known that partial discharges of high magnitude and high repetition rate develop shortly before a major failure, continuous monitoring of electric equipment while it is kept on-line to provide early warning is very desirable.

Partial discharge can also be measured using instruments such as Robinson, Haefly or Tettex partial discharge detectors by coupling to the lower part of the bushing on the transformer or to the windings using capacitor dividers and a toroid system. Such detectors detect high frequency electrical signals only. These instruments are normally used in a test bay during high voltage proving tests for a new or re-wound transformer. These measurements can, however, normally not be undertaken in a substation location due to the high level of electrical noise interference. Making reliable readings with these instruments also requires considerable skill.

One device for detecting the occurrence of a single partial discharge event in a transformer is described in International Application No PCT/AU94/00263 (WO 94/28566). This device comprised an ultrasonic transducer and a radio frequency antenna that were mounted through the transformer wall or roof and adapted respectively to detect the ultrasonic and radio frequency pulses generated by a partial discharge. If a radio frequency signal was detected within a pre-set time period before detection of an ultrasonic signal, a partial discharge was assumed to have occurred. While able to detect such signals, one problem with the device described in WO 94/28566 was that electrical noise within the transformer would generate randomly occurring radio signals that lead to the triggering of false alarms on occurrences of partial discharge. Shutting down a transformer based on a false alarm is clearly undesirable and costly.

An improved device for the detection of partial discharge is described in International Patent Application No PCT/AU00/01028 entitled "Partial discharge monitoring system for transformers" which was developed by one of the co-inventors of the present application. This improved device uses signal processing techniques to discriminate detection of signals indicative of partial discharge from other signals generated due to the noisy electromagnetic environment normally present in on-line high voltage electrical equipment, such as transformers.

Both of the devices described above-rely on fixed transducer heads being mounted to the electrical equipment that is being monitored by the device. Such an arrangement is practical and cost-effective where the electrical equipment being tested is a large and expensive high voltage transmission and generator transformer. In the case of relatively cheaper small transformers or where it is desired to institute screening by monitoring for partial discharge of transformers already in use, the costs of mounting a fixed head transducer arrangement and monitoring the transformer may be uneconomic.

Any discussion of documents, acts, materials, devices, articles or the like which has been included in the present specification is solely for the purpose of providing a context for the present invention. It is not to be taken as an admission that any or all of these matters form part of the prior art base or were common general knowledge in the field relevant to the present invention as it existed before the priority date of each claim of this application.

SUMMARY OF THE INVENTION

Throughout this specification the word "comprise", or variations such as "comprises" or "comprising", will be understood to imply the inclusion of a stated element, integer or step, or group of elements, integers or steps, but not the exclusion of any other element, integer or step, or group of elements, integers or steps.

The present invention is directed to a device that, in certain circumstances, can economically monitor for occurrences of partial discharge in high voltage electrical equipment. Whilst not necessarily portable, the device can preferably be easily and quickly re-located from one transformer to another with only a brief outage.

According to a first aspect, the present invention is an ultrasound detection device, the device comprising an ultrasonic transducer means mounted on an electrically insulating elongate member.

The detection device preferably includes a transducer means for detection of radio frequency pulses or waves or what is hereinafter referred to as a radio frequency (RF) transducer. The RF transducer can comprise an antenna selected from the group of a ferrite core aerial, a solenoid, a tuned circuit, or a capacitive metal plate.

The RF transducer can be mounted within the elongate member or incorporated into the encapsulation surrounding the ultrasonic transducer. In a still further embodiment, the RF transducer can be mounted externally to the elongate member and/or the radio frequency signal can be sampled from the transformer bushing capacitor taps or the neutral to earth tap.

Preferably, the RF transducer is a capacitor made from hollow concentric metal cylinders. The RF transducer is preferably adapted to detect radio frequency pulses generated by the occurrence of a partial discharge in an item of electrical equipment, such as a transformer. The RF transducer will also normally detect a range of other radio frequency pulses generated within the equipment when it is on-line.

The ultrasonic transducer and radio frequency transducer are preferably adapted to detect ultrasonic pulses and radio frequency pulses, respectively generated on the occurrence of a partial discharge in on-line electrical equipment, such as a transformer. By on-line, it is to be understood that the transducers can detect the pulses when the equipment is being operated or in use. This might include when the equipment is being operated under normal operating conditions, but can also include situations where the equipment is being operated in abnormal conditions or being operated for the purposes of its testing.

In a preferred embodiment, the ultrasonic pulses and the radio frequency pulses generated by the partial discharges in a transformer can be quasi-continuously monitored in real time, digitally sampled, data processed and analysed.

In a preferred embodiment, the ultrasonic transducer and radio frequency transducer means are mounted at or adjacent one end of the elongate member. In another preferred embodiment, the ultrasonic transducer and radio frequency transducer means are mounted at said one end of the elongate member.

The elongate member can comprise an elongate tube. The tube can be cylindrical. In a preferred embodiment, the tube has a constant cross-sectional diameter along its length. The tube preferably has a lumen. The lumen is preferably cylindrical. The lumen is further preferably concentric about the longitudinal axis of the tube.

The elongate tube can be formed from an electrically insulating rated glass fibre material. Other suitable materials include materials normally used as electrically insulating materials in high voltage equipment, such as thermoplastics, thermosets or ceramics. By using the term "electrically insulating", it is to be understood that even very electrically resistive materials do have a very small electrical conductivity. As such, the term is to be understood as describing materials that would normally be used in an electrical environment, particularly a high voltage electrical environment, and still be regarded by persons sidlled in that art as electrically insulating materials.

The ultrasonic transducer is preferably fixed to the elongate member in a non-removable manner. It will, however, be appreciated that the ultrasonic transducer means could be fabricated and mounted to the elongate member such that it was removably attached to the elongate member. Orientation of the front face of the ultrasonic transducer to obtain a good peripheral acoustic wave view of the windings and the main parts inside the transformer is important to ensure detection of the ultrasonic pulses. Once attached, the ultrasonic transducer means can be affixed in its angular orientation relative to the elongate member by mounting it on a wedge.

In another embodiment, the angular orientation of the faces of the ultrasonic transducer means is adjustable. Adjustment of the transducer orientation means is preferably controllable by a control means mounted at or adjacent an end of the elongate member distal the ultrasonic transducer means. The angle of orientation of the front face of the ultrasonic transducer can also be changed by twisting the distal end manually or by using a motor drive. This allows acoustic wave scanning of the main internal parts of the transformer.

The ultrasonic transducer means preferably comprises a piezoelectric element. The piezoelectric element preferably has a first face and a second face. The piezoelectric element preferably has a thickness resonant frequency between about 50 and about 300 kHz, more preferably 100 kHz to 250 kHz. The piezoelectric element preferably has a maximum operating temperature of at least 100° C. and more preferably at least 120° C. The piezoelectric element preferably can also withstand mechanical vibrations at least up to 5 g.

The piezoelectric element is further preferably formed from a ceramic/polymer composite material as described in International Application No. PCT/AU94/00263 (WO 94/28566) and International Patent Application No PCT/AU00/01028 entitled "Partial discharge monitoring system for transformers". The difference in this invention is that even though the composite material is the same the transducer design is different since it had to be adapted to suit relocation, orientation and sweeping of the transducer. A brief description of the special composite material will be provided to show how it is tailored for the application of detecting partial discharges in mineral oil. As described in the above patent applications, the piezoelectric element preferably has a 1-3 geometry providing selective increased sensitivity in one direction and reduced lateral sensitivity so as to reduce the effect of shear waves in the transformer tank wall. The ceramic can be selected from the group comprising poly-crystalline lead titanate, lead zirconate titanate (PZT), lead niobate or barium titanate. The polymer is preferably a thermosetting polymer. The thermosetting polymer can be selected from the group comprising epoxy resin, polyurethane, silicone or Bakelite.

The fabrication, poling of the ceramic and production of the composite piezoelectric material is as described in the above patent applications. The result is a set of parallel ceramic columns or pegs supported in the thermoset epoxy.

An outer casing of epoxy provides extra support for the outer pegs in the composite and helps to prevent any inadvertent breakage of them, especially when the composite is subsequently sliced from the supporting block. The outer casing serves to further decrease the lateral sensitivity of the transducer to shear waves and lateral high frequency vibrations in the transformer wall that are unrelated to ultrasonic waves due to partial discharge.

The particular composite transducer used for the fixed or permanent heads is described in International Patent Application No PCT/AU00/01028 entitled "Partial discharge monitoring system for transformers". In common with the composite transducer used for this patent application:

(i) the composite transducer preferably has a short ring down time so that it recovers quickly from detection of an ultrasonic pulse and is ready to detect the next one. To increase the damping of the transducer, a backing plate can be cemented to the second surface of the transducer. The backing plate is preferably formed from a tungsten loaded epoxy.

(ii) The matching layer can also be attached to the first surface of the composite transducer. The matching layer can comprise one or more layers of the thermosetting polymer used in the composite. The thickness of this matching layer is preferably a quarter wavelength of the transducer thickness resonant frequency. The matching layer acts as an acoustic impedance converter between the higher acoustic impedance of the pegs and that of the oil thus improving the acoustic impedance matching of the composite overall. The acoustic impedance of the transducer is preferably as close as possible to the acoustic impedance of the oil so as to minimise the reflections of longitudinal ultrasonic waves at the first surface of the transducer. For maximum transfer, the matching layer is preferably the geometric mean of the composite and the oil. The matching layer also acts as a wear plate to protect the composite during use.

(iii) The composite transducer can have a tuning inductor electrically connected between the copper wires connected to the first and second surface electrodes to further enhance the sensitivity. The tuning inductor is preferably shielded to prevent magnetic pickup by the inductor in the transformer environment.

(iv) Once manufactured, each composite transducer is preferably tested using an impedance analyser to measure the electromechanical coupling of the transducer, the electromechanical coupling being a measure of the efficiency of the transducer in converting mechanical energy due to the ultrasonic waves into electrical energy.

The differences in design, fabrication and characteristics between the composite transducer used for the permanent heads described in International Patent Application No PCT/AU00/01028 entitled "Partial discharge monitoring system for transformers" and this relocatable head are as follows:

(i) Smaller diameter and volume;
(ii) Different electrical impedance;
(iii) Different hydrostatic piezoelectric coefficient;
(iv) Different mounting to allow insertion and retraction;
(v) Mounting to allow either fixed, manually adjustable angular orientation or sweeping through an angular range; and
(vi) Changed fabrication procedure In another embodiment for gas filled transformers, the ultrasonic transducer can be manufactured from a piezoelectric polymeric material. In one preferred embodiment, the piezoelectric polymeric material can be polyvinylidene fluoride (PVDF).

Cabling to allow transmission of signals from the ultrasonic transducer preferably extends back through the lumen of the elongate member. Where the RF transducer is also mounted in the elongate member, cabling to allow transmission of signals from this transducer also preferably extends back through the lumen. The cabling can extend to cable terminations formed at the distal end of the elongate member. When in use, connection can be made with the cable terminations to allow transmission of the signals to respective transducer circuitries as described in International Patent Application No PCT/AU00/01028 entitled "Partial discharge monitoring system for transformers", the contents of which are incorporated herein by reference.

In a preferred embodiment, the outputs of the respective transducer circuitries can be transmitted to a signal processing and analysing means again as described in International Patent Application No PCT/AU00/01028 entitled "Partial discharge monitoring system for transformers".

In a preferred embodiment, the elongate member is mountable within a supporting means. The supporting means is preferably, in turn, mountable to high voltage electrical equipment with the ultrasonic transducer positioned within the equipment. When mounted in the supporting means, the elongate member preferably extends through the supporting means with its end distal the ultrasonic transducer positioned external the supporting means.

In one embodiment, the supporting means is mountable to a transformer, such as high voltage, instrument, current or high frequency transformers. The supporting means can be mounted to a flange of an access port for the transformer. In another embodiment, the supporting means can be mounted to a flange of an outlet, and/or inlet oil valve of the transformer, or sampling valve. Such valves are normally used to allow filling or emptying of the transformer with mineral oil. For some transformers, other oil sampling valves are available.

The supporting means preferably includes a flange adapted to abut or mate with the flange of the outlet and inlet valve. The supporting means further preferably includes an oil storage chamber that can be filled with mineral oil when the supporting means is mounted to the valve and the valve is opened. Preferably mounted to the oil storage chamber is a gland box surrounding a locking medium for the elongate member when it is passed therethrough. An orifice is preferably formed in the wall of the oil storage chamber to allow passage therethrough of the elongate member from internal the oil storage chamber to the interior of the gland box. A washer or O-ring can be positioned in the orifice in the oil storage chamber and around the elongate member to prevent egress of mineral oil through the orifice.

The locking medium preferably comprises packing material that can surround the elongate member. The packing material can comprise a polytetrafluoroethylene (PTFE) packing material. Removably mounted to the gland box is a gland cap having a ram cylinder mounted therein. The gland cap can be screw mounted to the gland box. The gland cap preferably has an orifice to allow passage of the elongate member therethrough. A washer or O-ring can be positioned in the orifice and around the elongate member to prevent egress of mineral oil through this orifice.

On mounting of and relative tightening of the gland cap onto the gland box, the packing material is preferably relatively compressed by the ram cylinder thereby increasing the frictional engagement made between the packing material and the elongate member and so locking the elongate member in position.

When it is desired to adjust the extent to which the elongate member is inserted into the transformer, the gland cap can be partially relatively unscrewed so reducing the frictional engagement between the packing material and the elongate member. The elongate member can then be further inserted or retracted as is required.

When the flange of the supporting means is abutted or mated with the flange of the electrical equipment or transformer, a gasket is preferably positioned between the respective flanges. The gasket can comprise a rubberised cork ring.

The oil storage chamber preferably has a bleed valve to allow air to escape the oil storage chamber when the chamber is being filled with oil following mounting to a transformer. The bleed valve is preferably positioned on an upper surface of the oil storage chamber. Once filled with oil, the bleed valve would be closed. The oil storage chamber preferably also has a drain valve to allow drainage of oil from the oil storage chamber. The drain valve is preferably positioned on a lower surface of the oil storage chamber. While in use, the drain valve would normally remain closed. When it is desired to remove the supporting means from the transformer, the inlet and outlet valve of the transformer would firstly be closed before opening the drain valve to drain the oil from the storage chamber.

In a further embodiment, more than one ultrasound detection device can be adapted to be mounted to an item of electrical equipment, such as a transformer. The signals output by the plurality of devices can be used as a means of locating the position of a partial discharge source in the equipment.

BRIEF DESCRIPTION OF THE DRAWINGS

By way of example only, a preferred embodiment of the invention is now described with reference to the accompanying drawings, in which.

PREFERRED MODE OF CARRYING OUT THE INVENTION

Figure 1:
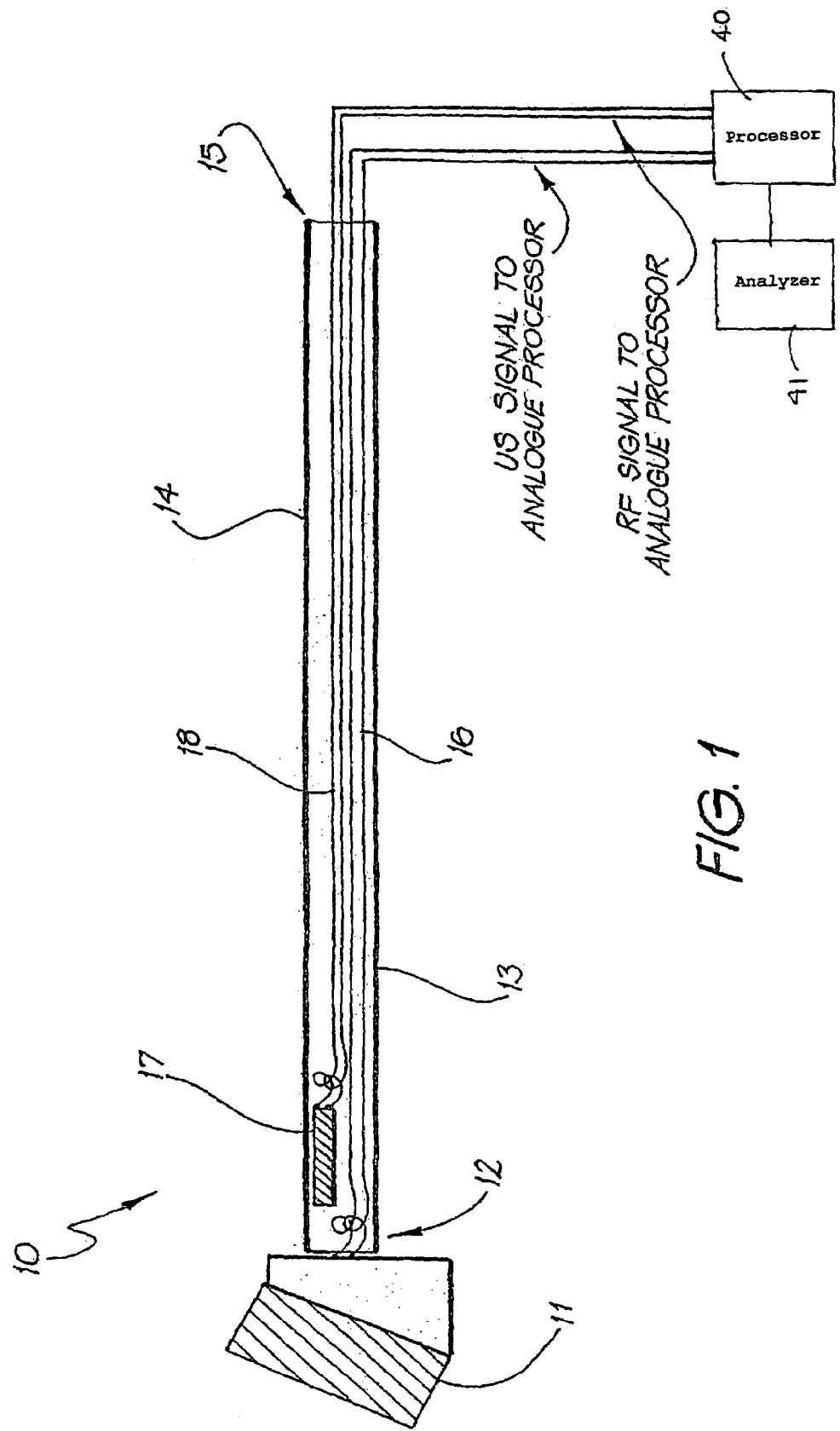
FIG. 1 is a cross-sectional view of a transducer probe according to the present invention.

A transducer probe according to the present invention for use in the detection of occurrences of partial discharge in on-line high voltage electrical equipment, such as transformers, is depicted generally as 10 in FIG. 1.

The probe 10 includes an ultrasonic transducer 11 mounted at one end 12 of an elongate electrically rated glass fibre rod 13. The rod 13 has the form of a cylindrical tube with a central lumen 14 running therethrough from the one end 12 to a distal end 15.

The depicted ultrasonic transducer 11 is a ceramic/polymer composite having a 1–3 geometry. The ceramic within the transducer 11 is lead zirconate titanate (PZT). The polymer in the composite is a thermosetting epoxy resin. It will be appreciated that other suitable piezoelectric materials, including piezoelectric ceramics and polymers could be utilised as the ultrasonic transducer 11 in the present invention.

Each face of the composite transducer 11 has an electrode for the accumulation of charge. In the depicted embodiment, each electrode comprises a layer of silver loaded epoxy adhesive into which has been pressed a brass gauze sheet.

Electrical connection from each face of the transducer 11 is made through cables 16 that extend back through the lumen 14 of the rod 13. The cables 16 extend to ultrasonic detector signal circuitry 40 that receives the signals of the transducer 11, processes them and then provides an output to an analyzing means 41, such as is described in International Patent Application No PCT/AU00/01028.

A radio frequency transducer 17 is also positioned within the lumen 14 of the rod 13 immediately behind the ultrasonic transducer 11. The depicted RF transducer 17 comprises a RF capacitive pick-up. Electrical connection from the RF transducer is provided by cables 18 that also extend back through the lumen 14 of the rod 13. The cables 18 extend to RF transducer signal circuitry 40 that receives the signals of the transducer 17, processes them and then provides an output to the analyzing means 41.

The RF transducer does not necessarily need to be located within the probe 10. For example, a radio frequency (RF) pickup could be coupled externally to the transformer 30 to a bushing capacitor tap or from the neutral to earth tap. It can also be cylindrical capacitor mounted around or within the lumen 14.

Figure 2:
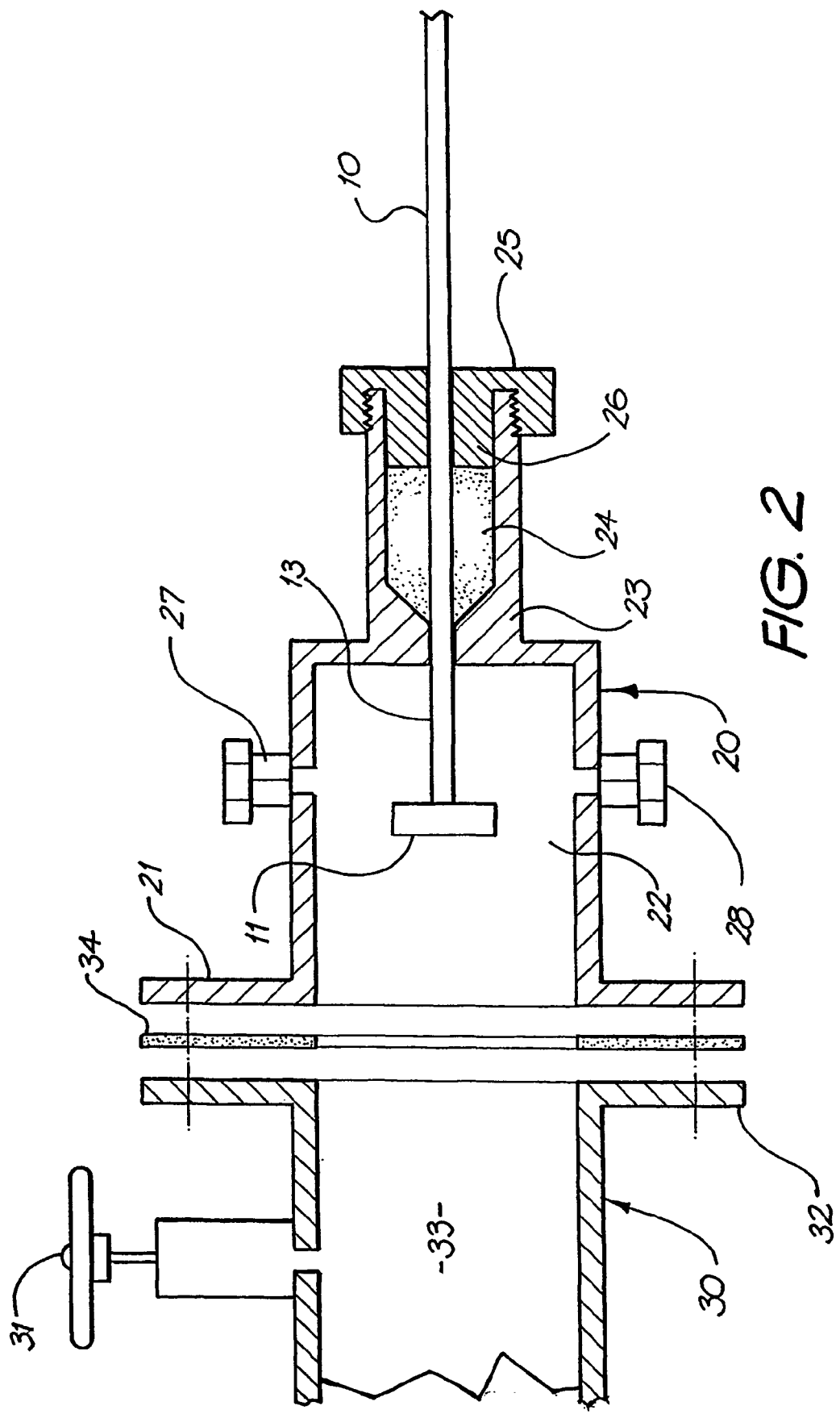
FIG. 2 is a simplified view of a re-locatable transducer head with the transducer probe depicted in a retracted position.
Figure 3:
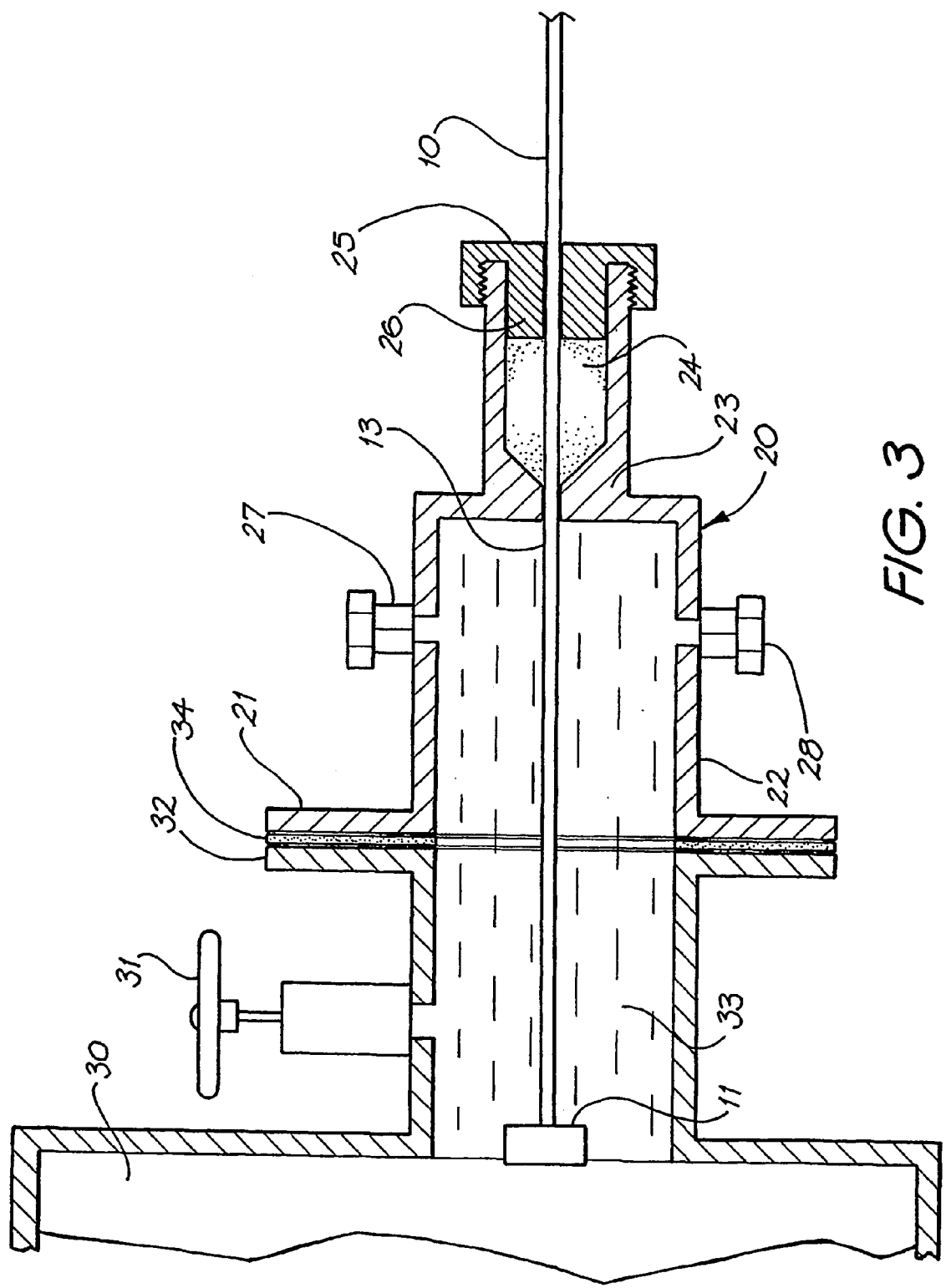
FIG. 3 is a simplified view of the re-locatable transducer head of FIG. 2 with the transducer head positioned in an inserted position.

As is depicted in FIGS. 2 and 3, the probe 10 is slidably mountable within a supporting means, such as transducer head 20. The transducer head 20 can be removably attached to high voltage electrical equipment, such as a transformer 30 which is partially depicted in FIGS. 2 and 3.

The head 20 can be mounted to a flange 32 of a port having a sampling outlet or inlet oil valve 31. Such valves are normally used to allow filling or draining of an oil-filled transformer. The head 20 has an annular flange 21 adapted to mate with the flange 32 on the transformer 30. A rubberised cork gasket 34 is positioned between flange 21 and flange 32 to prevent leakage of mineral oil 33 from the transformer when the flanges 21, 32 are bolted together.

The head 20 includes an oil storage chamber 22 that can be filled with mineral oil 33 when the head 20 is mounted to flange 32 and tap on oil valve 31 is opened. A gland box 23 is also mounted to the oil storage chamber 22. The gland box 23 contains a quantity of polytetrafluoroethylene (PTFE) packing material 24 that surrounds the rod 13 of probe 10. Removably mounted to the gland box 23 is an internally threaded cap 25, the thread being complementary to an external screw thread on the outer end of the gland box 23. Extending inwardly of the cap 25 is a ram cylinder 26 that serves to relatively compress the packing material 24 when the cap 25 is screwed down onto the box 23. Compression of the packing material 24 increases the frictional engagement of the packing material relative to the rod 13 and so serves to hold the rod 13 in a desired position. This is the main sealing mechanism for the gland box and prevents oil leakage.

When it is desired to adjust the extent to which the probe 10 is inserted into the transformer 30, the gland cap 25 can be partially unscrewed so reducing the frictional engagement between the packing material 24 and the rod 13. The rod 13 can then be advanced further into the transformer 30 as is depicted in FIG. 3 or withdrawn to a more retracted position as is depicted in FIG. 2. Once in the desired position, the cap 25 can be re-tightened to again lock the rod 13 in position.

A bleed valve 27 is provided on the upper edge of the oil storage chamber 22 to allow air to escape from the chamber 22 when it is being filled with oil 33 following mounting of the head 20 to the transformer 30. Once filled with oil, the valve 27 is closed. A drain valve 28 is also provided on the lower edge of the chamber 22. The drain valve 28 is used to drain the chamber 22 of oil before removal of the head 20 from the transformer 30.

The head 20 and probe 10 of the present invention are useable with different transformers rather than being part of a system that is permanently mounted to the electrical equipment It is easy to relocate the transducer head from one transformer to another. A number of transformers are normally housed in an electrical sub-station. The present invention can be used to test and monitor for a short period each transformer at a sub-station on a roster basis. It can also be used during factory over voltage approval tests. Also, it can be temporarily installed and used to locate a fault for a transformer which has high gas figures.

When a particular transformer requires monitoring, it is shut down and the head 20 is bolted to the flange 32 of the transformer 30. The tap on valve 31 is then opened to allow mineral oil to enter the head chamber 22. While oil is entering is the chamber 22, the bleed valve 27 is open to allow air to escape from the chamber 22. When the chamber 22 is full, the bleed valve 27 is closed. Once filled, the probe 10 is pushed inwardly relative to the head 20 until the RF transducer 17 and ultrasonic transducer 11 are within the transformer 30, as depicted in FIG. 3. Insertion of the probe 10 serves to ensure that the transducers 11, 17 are in a good position inside the transformer for detection of the ultrasonic and RF signals.

Once inserted the probe 10 can be rotated and swept through a range of angles by twisting the distal end 15 manually or using a motor drive so that the main internal parts of the transformer are acoustically scanned. When motor driven scanning is carried out, the transducer would traverse through a range of angles along selected lock. The motor drive can be magnetically coupled to the transducer 10 using Nd alloy magnets attached to the outside of probe tube 13.

Once in place, electrical connection is made between the respective sets of cables 16, 18 to the processing circuitry and power is supplied to the circuitry. Outputs from the analysing means can be monitored at the location of the transformer 30 or be transmitted via optical fibre cable or other means to a computer monitoring the transformer 30. Such a computer may be located nearby mounted in a van or on a trolley or in the substation office. With a modem installed and a phone line connected, remote monitoring is available from any distant location.

Once ready, the transformer 30 is switched on and, if desired, brought on-line. Calibration of the outputs of the transducers can be undertaken before the head 20 is left to monitor the transformer 30. Such monitoring may only occur for a few hours but could conceivably last days, weeks, months or even longer, if desired.

When monitoring of the transformer 30 is complete, the system and transformer 30 are shut down. The cap 25 is partially unscrewed to loosen the probe 10 which is then withdrawn back into the chamber 22. Valve 31 is then closed before the mineral oil is drained through valve 28 from chamber 22. The bleed valve 27 is open during this draining procedure.

All electrical connections are then detached before the head 20 is unbolted from flange 32.

Once detached, the head 20 and probe 10 can be installed on another transformer. Depending on the location of the transformer, extra cabling, such as fibre optic cabling, may need to be installed to allow transmission of signals from the head 20 to the monitoring computer in the sub-station office.

It will be appreciated by persons skilled in the art that numerous variations and/or modifications may be made to the invention as shown in the specific embodiments without departing from the spirit or scope of the invention as broadly described. The present embodiments are, therefore, to be considered in all respects as illustrative and not restrictive.

The invention claimed is:

1. An apparatus for detecting partial discharge in on-line electrical equipment, the apparatus comprising:
   (a) a partial discharge detector that, while in use, continuously monitors the electrical equipment and comprises:
      (i) an electrically insulating elongate member that is adjustably extendible into the electrical equipment;
      (ii) an ultrasonic transducer means mounted at or adjacent a first end of the elongate member for detecting an ultrasonic pulse or wave generated by the occurrence of a partial discharge in the equipment and outputting a signal corresponding to this detection; and
      (iii) a RF transducer means for detecting at least the radio frequency (RF) pulses or waves generated by the occurrence of a partial discharge in the equipment and outputting a signal corresponding to this detection,
      said RF transducer means being adapted in operation to detect said radio frequency (RF) pulses or waves concurrently with the operation of the ultrasonic transducer means;
   (b) a support means for the partial discharge detector that is in turn removably mountable to the electrical equipment such that both the ultrasonic transducer means and the RF transducer means are positioned within the equipment and the elongate member extends through the support means to a second end positioned external the equipment; and (c) a signal processing and analyzing means that receives the signals output by both the ultrasonic transducer and the RF transducer means for detecting at least the radio frequency (RF) pulses or waves and provides an output indicative of detection of partial discharge on occurrence of such a discharge.

2. An apparatus for detecting partial discharge of claim 1 wherein the RF transducer means for detecting at least the radio frequency (RF) pulses or waves comprises an antenna selected from the group comprising a ferrite core aerial, a solenoid, a tuned circuit, and a capacitive metal plate.

3. An apparatus for detecting partial discharge of claim 1 wherein the ultrasonic transducer means is encapsulated in an encapsulant and the RF transducer means for detecting at least the radio frequency (RF) pulses or waves is mounted in the encapsulant.

4. An apparatus for detecting partial discharge of claim 1 wherein the ultrasonic transducer means and RF transducer means for detecting at least the radio frequency (RF) pulses or waves are mounted at or adjacent one end of the elongate member.

5. An apparatus for detecting partial discharge of claim 1 wherein the elongate member comprises an elongate tube having a lumen.

6. An apparatus for detecting partial discharge of claim 5 wherein the elongate tube is formed from a material selected from the group comprising an electrically insulating rated glass fibre material, a thermoplastic material, a thermoset, and a ceramic.

7. An apparatus for detecting partial discharge of claim 5 wherein at least one signal transmission cable extends from the ultrasonic transducer means through the lumen of the elongate member to an end of the elongate member distal the transducer means.

8. An apparatus for detecting partial discharge of claim 1 wherein the ultrasonic transducer means is fixedly mounted to the elongate member.

9. An apparatus for detecting partial discharge of claim 1 wherein orientation of the ultrasonic transducer means is adjustable.

10. An apparatus for detecting partial discharge of claim 1 wherein the ultrasonic transducer means comprises a piezoelectric element formed from a ceramic/polymer composite material, wherein the ceramic is selected from the group comprising poly-crystalline lead titanate, lead zirconate titanate (PZT), lead niobate and barium titanate, and the polymer is selected from a group comprising epoxy resin, polyurethane, silicone and Bakelite™.

11. An apparatus for detecting partial discharge of claim 1 wherein the ultrasonic transducer means is formed from a piezoelectric polymeric material.

12. An apparatus for detecting partial discharge of claim 1 wherein the support means is mountable to a transformer selected from the group consisting of a high voltage transformer, an instrument transformer, a current transformer, and a high frequency transformer.

13. An apparatus for detecting partial discharge of claim 1 wherein the support means has a flange adapted to abut or mate with a flange of an outlet and inlet oil valve on the electrical equipment.

14. An apparatus for detecting partial discharge of claim 13 wherein the support means further comprises an oil storage chamber that is fillable with mineral oil when the supporting means is mounted to the valve of the electrical equipment and the valve is opened.

15. An apparatus for detecting partial discharge of claim 14 wherein the support means further comprises a gland box mounted to the oil storage chamber, the gland box and oil storage chamber having alignable orifices to allow passage therethrough of the elongate member, the gland box containing a packing material that surrounds a portion of the elongate member passing therethrough.

16. An apparatus for detecting partial discharge of claim 15 wherein the packing material is polytetrafluoroethylene (PTFE).

17. An apparatus for detecting partial discharge of claim 15 further comprising a gland cap, having a ram cylinder mounted therein, that is removably mountable to the gland box, the cap having an orifice to allow passage of the elongate member therethrough, wherein on mounting of the gland cap to the gland box, the packing material is relatively compressed by the ram cylinder thereby increasing the frictional engagement made between the packing material and the elongate member and so locking the elongate member in position.

* * * * *